United States Patent [19]

Rouam

[11] 4,143,319

[45] Mar. 6, 1979

[54] METHOD FOR MAGNETICALLY DETERMINING THE DEGREE OF WEAR OF A PISTON RING OF AN INTERNAL COMBUSTION ENGINE WHILE RECIPROCATING THEREON

[75] Inventor: Jean S. R. Rouam, Marly la Ville, France

[73] Assignee: Societe d'Etudes de Machines Thermiques S.E.M.T., Saint Denis, France

[21] Appl. No.: 694,681

[22] Filed: Jun. 10, 1976

[30] Foreign Application Priority Data

Oct. 1, 1975 [FR] France ................................ 75 30108

[51] Int. Cl.[2] ............................................ G01R 33/12

[52] U.S. Cl. .................................... 324/219; 324/228; 73/7; 73/120; 33/DIG. 17; 340/52 R

[58] Field of Search .................. 324/34 R; 73/120, 7; 33/DIG. 17, 174 L; 340/52 A; 51/165.74

[56] References Cited

U.S. PATENT DOCUMENTS 3,975,706 8/1976 Kato ................................ 340/52 A

*Primary Examiner*—Robert J. Corcoran

*Attorney, Agent, or Firm*—Jay L. Chaskin

[57] ABSTRACT

A method for determining the degree of the wear condition of a piston ring in sliding contact with a cylinder wall of an internal combustion engine. The piston ring has a defined magnetic property which property in sliding contact with the wall may be varied by a chromium plating. The reluctance of a magnetic field of an inductive sensor located in the cylinder wall is varied as the piston ring reciprocates and wears. The reluctance variation is compared with a predetermined reference level of the magnetic property for an acceptable degree of wear for the ring.

4 Claims, 3 Drawing Figures

Figure 1:
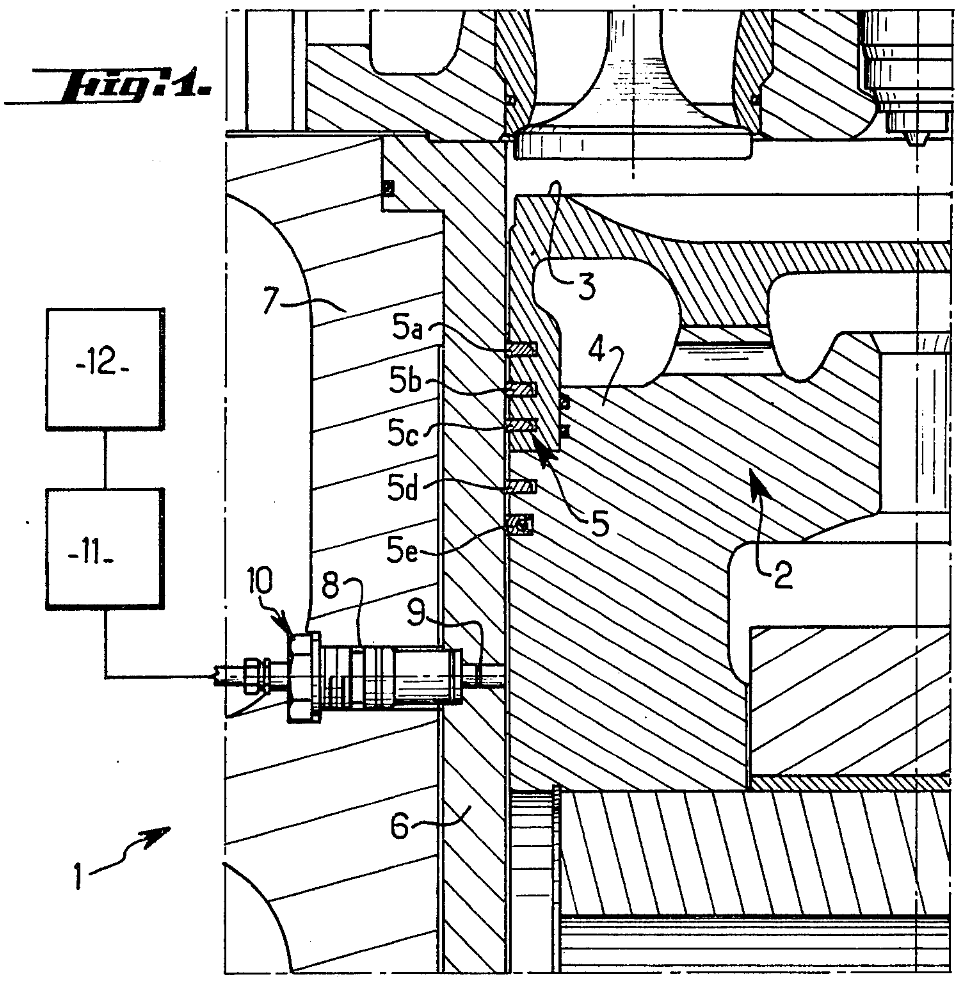

METHOD FOR MAGNETICALLY DETERMINING THE DEGREE OF WEAR OF A PISTON RING OF AN INTERNAL COMBUSTION ENGINE WHILE RECIPROCATING THEREON

The invention has for its object a method for determining the wear condition of an element having definite magnetic properties in sliding contact with a second element, and in particular of a piston ring, for example an upper or "fire" piston-ring, in a reciprocating-piston internal combustion engine during operation.

The invention falls within the general field of the problems encountered in the supervision and maintenance of the components liable to alterations such as wear under the action of, for example, pressure, temperature, etc., leading at a given moment to the necessity of replacing the defective components.

This supervision and maintenance problem assumes great importance where the components considered are constituent parts of an assembly which does not allow for access to the said components without requiring a relatively long stoppage of the assembly in order to perform the desired repair or change. It is therefore desirable that any such action be taken only for a certainty. This problem applies in particular to the piston rings of reciprocating-piston internal combustion engines.

According to a first known method, the problem of piston ring wear is solved by statistically determining the number of hours of operation of the engine at the end of which the condition of the said rings must be checked. The main drawback to this determination method lies in the fact that it involves some uncertainty which may lead to either useless or belated action.

According to a second method, an attempt has been made to reduce the said uncertainty by carrying out measurements, during actual running of the engine, of certain parameters which are converted into pulses visualized for example on an oscilloscope and indicative of the condition of the component to be supervised or monitored. Where the components to be supervised are the piston rings of an internal combustion engine, use is made of the induction variations of at least one stationary inductive sensor caused by the rings when the pistons pass in front of the said sensors in order to determine the condition of the said rings with respect to a reference condition corresponding to normal running. This method, in fact, is a qualitative one. Indeed, what is measured is not the degree of wear of the rings but their condition by investigating the shape of the pulses and their position with respect to a reference level, which pulses indicate the sensor induction variations. A drawback to this method is that it gives no indication as regards the progress of the degree of wear of the rings and allows only the functioning condition of the rings to be judged.

The invention is directed at avoiding the aforementioned drawbacks and provides a method for quantitatively measuring the degree of wear of the piston rings of an internal combustion engine so as to allow the time of maintenance action, i.e. the time when the permissible maximum wear limit is reached, to be determined for a certainty or without fail or error.

The invention therefore provides a method for determining the degree of the wear condition of a component, having definite magnetic properties, in sliding contact with a wall, characterized in that it consists, in order to allow for the said determination during the operation of the assembly associated with the said component and with the said wall, in detecting and measuring the reluctance or magnetic-resistance variations in the magnetic circuit constituted by the said component.

Figure 2:
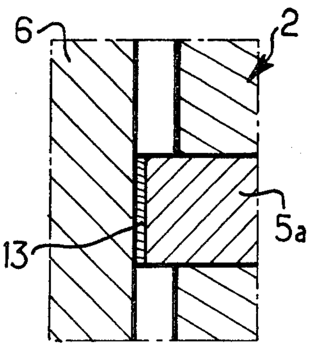
Figure 3:
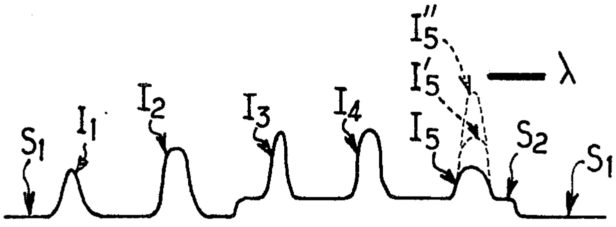

Other features, advantages and details will appear more clearly from the following explanatory description made with reference to the appended drawings given solely by way of illustration and wherein:

FIG. 1 is a partially sectional view illustrating the method according to the invention in the case of measurement of the degree of wear of the piston rings of an internal combustion engine, FIG. 2 is an enlarged partial sectional view illustrating a constructional detail of the upper piston-ring, and FIG. 3 is a graph illustrating in the form of pulses the determination of the degree of wear of the rings.

In order to clearly set out the method of the invention, the latter is herein described in connection with the measurement of the progress of the degree of wear of an internal-combustion-engine piston-rings and more particularly an upper piston-ring.

Referring to FIG. 1, there is diagrammatically shown an internal combustion engine 1 with one of its pistons 2 of the type comprising a steel head 3, an aluminium body or skirt 4, five piston-rings 5, the said piston being mounted within a liner 6 of the cylinder block 7. A bore 8 and a bore 9 in mutually confronting relationship are machined in the cylinder block 7 and the liner 6, respectively, to accommodate an inductive sensor 10, one end, or input, of which is flush with the inner surface of the liner 6. The position of the sensor 10 with respect to piston 2 is such that during the reciprocating motion of the latter all the rings 5 pass successively in front of the input of sensor 10.

The sensor output is connected to a signal processing circuit 11 comprising for example a current amplifying stage and a filter, the processing circuit 11 being in its turn connected to a visualizing device 12 allowing the signals from the sensor 10 to be visualized.

FIG. 2 shows a constructional detail of the upper ring **5*a* of piston 2, which ring is usually of steel and is peculiar in that it is provided with a chromium plating 13** in a manner known per se in order to increase the hardness of the ring, the said peculiarity allowing the method of the invention to be better explained.

Referring to FIG. 3, when there is no ring 5 opposite the sensor 10 and supposing the piston 2 is in its upper position, the sensor 10 supplies a constant signal or level $S_1$. When the first or scraper ring passes in front of the sensor there appears on the oscilloscope a pulse $I_1$ resulting from a change of induction in the sensor 10. Indeed, the ring **5*e*, the material of which has magnetic properties like all the other rings, produces a magnetic circuit which changes the induction in the sensor 10 and therefore its output current, which is indicated on the oscilloscope by the pulse $I_1$. Between the rings 5*e* and 5*d*, the sensor 10 again supplies a constant signal $S_1$ and so forth during the downward motion of piston 2 for the rings 5*d*, 5*c*, 5*b*, 5*a* producing respectively the pulses $I_2$, $I_3$, $I_4$, $I_5$. In the graph of FIG. 3, the presence is in fact observed of a contant level $S_2$ differing from the constant level $S_1$, and this simply results from the fact that the three rings 5*a*, 5*b*, 5*c* are located in the head of piston 2 which is of steel, whereas the rings 5*d*, 5*e* are in the piston body or skirt which is of aluminium, thus leading to a slight variation of the induction sensed by sensor 10**.

As for the upper ring *5a* or "fire" ring, the outer surface of which is chromium plated, the variations of the degree of wear of this ring can be followed very accurately. Indeed, since the coefficient of permeability of chromium is low, the reluctance of the ring, as compared with that of a ring which is not chromium plated and the material of which is generally steel and therefore has higher permeability, increases as the wear of the chromium plating progresses and in a greater proportion. Since the current output signal of the sensor 10 is proportional to the reluctance variations, the more the chromium layer 13 is worn the higher the output current, thus resulting in an increase in time of the amplitude of the pulse $I_5$ relating to the chromium-plated ring. This is indicated in FIG. 3 by the pulses $I'_5$, $I''_5$. By suitably calibrating the oscilloscope, a threshold can be defined to determine the permitted maximum amplitude of the pulse $I_5$ corresponding to a permissible maximum degree of wear.

Thus, according to the invention, the fact that the steel ring is chromium-plated allows the degree of wear of the ring to be measured accurately owing to the permeability of chromium being markedly lower than that of steel, thus resulting in greater variations of the output signal of sensor 10 and allows measurement of the degree of the wear condition of the ring.

By using at least two sensors mounted in the cylinder at one and the same level and in diametrally opposite relationship, a deformation of the piston ring can be detected when there is no coincidence between the two pulses produced by the two sensors, respectively.

To allow simpler reading of the degree of condition of wear of the upper piston-ring, it is desirable to provide filters in the processing circuit 11 to eliminate the pulses relating to the other piston rings and to retain only the one relating to the upper piston-ring. In addition, better reading can be ensured by amplifying the signal and superposing it on a reference graph indicating the permissible limit values.

Thus, in order to measure the degree of wear of an element in sliding contact with a second element, the said element is advantageously constituted by two materials having quite different magnetic permeabilities and the material to be subjected to wear is the one having the lower permeability.

Of course, the invention is by no means limited to the form of embodiment described and illustrated, which has been given by way of example only. In particular, it comprises all the means constituting technical equivalents to the means described as well as their combinations, should the latter be carried out according to the spirit of the invention and within the scope of the following claims.

What is claimed is:

1. A method for continuously measuring and following the degree of the wear condition of a piston ring of an internal combustion engine, having a predetermined magnetic permeability, in sliding reciprocating contact with a second element comprising the steps of:

providing said piston ring with a plating or coating having a predetermined magnetic permeability lower than the permeability of said piston ring;

establishing a reference level for an acceptable degree of wear for the plating or coating in sliding reciprocating contact with the second element;

measuring during the sliding reciprocating contact the reluctance variations in a magnetic circuit comprising the piston ring and an inductive sensor, the sensor being supported by the second element and having one end which is in sliding reciprocating contact with the plating or coating of the piston ring; and comparing the reluctance variations as measured by the sensor, to the reference level.

2. A method according to claim 1 wherein the piston ring comprises a steel material and the coating or plating comprises a chromium material.

3. A method according to claim 1 wherein the sensor is located in the cylinder block of a reciprocating piston engine and in magnetic contact with the piston.

4. A method according to claim 1 wherein the piston ring is the upper piston ring.

* * * * *